(12) United States Patent
Seong et al.

(10) Patent No.: US 9,449,733 B2
(45) Date of Patent: Sep. 20, 2016

(54) CONDUCTIVE INK COMPOSITION, PRINTING METHOD USING THE SAME AND CONDUCTIVE PATTERN MANUFACTURED BY THE SAME

(75) Inventors: Jiehyun Seong, Daejeon (KR); Joo Yeon Kim, Daejeon (KR); Young Chang Byun, Daejeon (KR); Jung Hyun Seo, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 291 days.

(21) Appl. No.: 14/004,640

(22) PCT Filed: Mar. 14, 2012

(86) PCT No.: PCT/KR2012/001840
§ 371 (c)(1),
(2), (4) Date: Sep. 11, 2013

(87) PCT Pub. No.: WO2012/124979
PCT Pub. Date: Sep. 20, 2012

(65) Prior Publication Data
US 2014/0000942 A1    Jan. 2, 2014

(30) Foreign Application Priority Data
Mar. 15, 2011   (KR) .................. 10-2011-0023068

(51) Int. Cl.
| | |
|---|---|
| *H01B 1/16* | (2006.01) |
| *B05D 5/12* | (2006.01) |
| *B41M 3/00* | (2006.01) |
| *C09D 11/037* | (2014.01) |
| *C09D 11/52* | (2014.01) |
| *H05K 1/09* | (2006.01) |
| *C09D 11/033* | (2014.01) |

(52) U.S. Cl.
CPC ........ *H01B 1/16* (2013.01); *B05D 5/12* (2013.01); *B41M 3/006* (2013.01); *C09D 11/033* (2013.01); *C09D 11/037* (2013.01); *C09D 11/52* (2013.01); *H05K 1/097* (2013.01)

(58) Field of Classification Search
CPC ............ H01B 1/00; H01B 1/16; H01B 1/22; B05D 5/12
See application file for complete search history.

(56) References Cited

U.S. PATENT DOCUMENTS

| | | | |
|---|---|---|---|
| 2009/0188555 A1 | 7/2009 | Castillo et al. | |
| 2010/0139513 A1 | 6/2010 | Seong et al. | |
| 2012/0031290 A1* | 2/2012 | Lee et al. ...................... | 101/395 |
| 2012/0225198 A1 | 9/2012 | Seong et al. | |

FOREIGN PATENT DOCUMENTS

| | | | | |
|---|---|---|---|---|
| CN | 101657883 A | | 2/2010 | |
| CN | 101932662 A | | 12/2010 | |
| KR | 1020060017686 | * | 2/2006 | ............. C09D 11/00 |
| KR | 10-2006-0120987 A | | 11/2006 | |
| KR | 1020060120987 | * | 11/2006 | ............. C09D 11/00 |
| KR | 10-2007-0025600 A | | 3/2007 | |
| KR | 2011-0021681 A | | 3/2011 | |

* cited by examiner

*Primary Examiner* — Mark Kopec
(74) *Attorney, Agent, or Firm* — Dentons US LLP

(57) ABSTRACT

The present invention relates to a conductive ink composition including metal particles, a first solvent having a vapor pressure of 3 torr or less at 25° C., a second solvent having a vapor pressure of more than 3 torr at 25° C., and metal carboxylate, a printing method using the same, and a conductive pattern manufactured by using the same.

17 Claims, 3 Drawing Sheets

7 μm

CONDUCTIVE INK COMPOSITION, PRINTING METHOD USING THE SAME AND CONDUCTIVE PATTERN MANUFACTURED BY THE SAME

This application is a national stage application of International Application No. PCT/KR2012/001840, filed on Mar. 14, 2012, which claims priority to and the benefit of Korean Patent Application NO. 10-2011-0023068, filed in the Korean Intellectual Property Office on Mar. 15, 2011, all of which are incorporated herein by reference.

TECHNICAL FIELD

The present invention relates to a conductive ink composition and a printing method using the same. More particularly, the present invention relates to a conductive composition for printing a fine pattern to form the fine pattern, and a printing method using the same.

BACKGROUND ART

Conductive parts such as electrodes are used in electronic diodes such as touch screens, displays, and semiconductors. As performance of the electronic diodes is improved, a finer conductive pattern is required in the conductive parts.

There are various known methods of forming a conductive pattern according to the purpose thereof, and representative examples thereof include a photolithography method, a screen printing method, an inkjet method and the like.

The photolithography method is a method of forming an etching protection layer on glass or film on which metal is deposited, selectively exposing and developing the etching protection layer to perform patterning, selectively etching the metal by using the patterned etching protection layer, and stripping the etching protection layer.

However, the photolithography method does not use a constitutional element of the conductive pattern itself but uses an etching protection layer material and a stripping solution, thus increasing a process cost due to a cost of the etching protection layer material and the stripping solution and a discarding cost thereof. There is a problem of an environmental pollution according to discarding of the aforementioned materials. Since the method has a large number of processes and is complicated, much time and high costs are required, and in the case where the etching protection layer material is not sufficiently stripped, there is a problem in that defects occur in the final products.

The screen printing method is performed by a method of performing screen printing using ink on the basis of conductive particles having the size of several hundreds nanometers to several tens micrometers and then performing firing.

There is a limitation in implementing a fine pattern having the size of several tens micrometers by the screen printing method and the inkjet method.

DISCLOSURE

Technical Problem

The present invention has been made in an effort to provide a conductive ink composition that is suitable for a printing method, particularly a roll printing method, and particularly a reverse offset printing method, can implement a conductive pattern and a fine conductive pattern having excellent conductivity, has excellent adhesion property to a board, and can implement conductivity by low temperature firing, and a printing method using the same.

Technical Solution

An exemplary embodiment of the present invention provides a conductive ink composition, including: metal particles; a first solvent having a vapor pressure of 3 torr or less at 25° C.; a second solvent having a vapor pressure of more than 3 torr at 25° C.; and metal carboxylate.

The present invention uses a printing method using the conductive ink composition. The printing method may be a roll printing method or a reverse offset printing method. A printing blanket of a rubber material may be used in the reverse offset printing method.

Another exemplary embodiment of the present invention provides a conductive pattern formed by using the conductive ink composition, and an electrode substrate including the same. It is preferable that the conductive pattern be fired at a low temperature of 200° C. or less. In this case, it was confirmed that an ultrafine pattern where a minimum line width of the conductive pattern was 6 μm or less and a minimum interval between lines was 3 μm or less could be formed.

Advantageous Effects

A conductive ink composition according to the present invention is suitable for a printing method, particularly a roll printing method, and particularly a reverse offset printing method, can implement a conductive pattern and a fine conductive pattern having excellent conductivity, has excellent adhesion property to a board, and can implement conductivity by low temperature firing. Accordingly, according to the present invention, it is possible to provide an ultrafine conductive pattern having excellent adhesion property to a board and excellent conductivity. Particularly, the conductive ink composition according to the present invention can provide excellent conductivity and fine patterns even in the case where firing is performed at low temperatures even though the conductive ink composition does not include a polymer binder or a release agent.

MODE FOR INVENTION

Hereinafter, the present invention will be described in more detail.

The present invention relates to a conductive ink composition, and includes metal particles, a first solvent having a vapor pressure of 3 torr or less at 25° C., a second solvent having a vapor pressure of more than 3 torr at 25° C., and metal carboxylate. The conductive ink composition according to the present invention does not substantially include a polymer binder or a release agent.

The conductive ink composition according to the present invention is suitable for a printing method, and particularly, a roll printing method, and reverse offset printing using a printing blanket of a rubber material of the roll printing method because of a reason to be described below.

Figure 1:
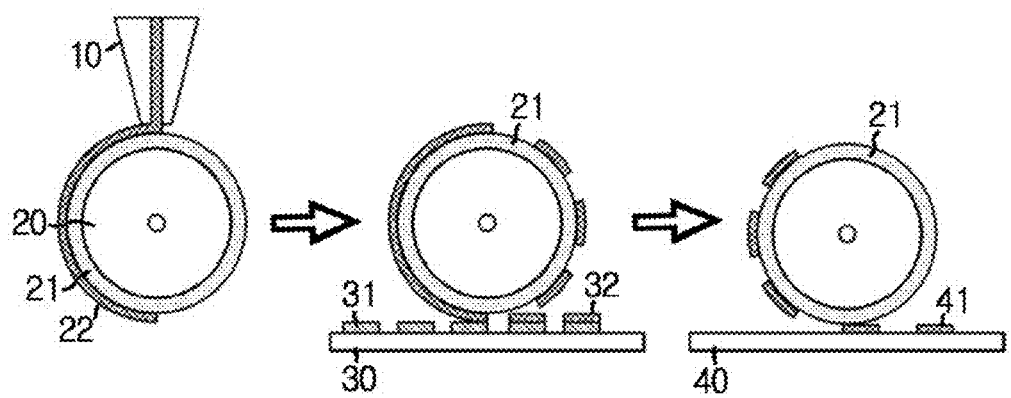
FIG. 1 illustrates a process mimetic diagram of a reverse offset printing method.

The reverse offset printing method includes i) applying a conductive ink composition on a roller; ii) bringing a cliché on which a pattern corresponding to a conductive pattern to be formed is engraved into contact with the roller to form the pattern of the ink composition corresponding to the conductive pattern on the roller; and iii) transferring the ink composition pattern on the roller onto a substrate. In this case, a circumferential portion of the roller is constituted by a printing blanket of a rubber material having elasticity. The reverse offset printing method is illustrated in FIG. 1.

A polymer binder is added to known ink so that after ink is applied on a roller, a film is not cracked, a pinhole is not formed, and a uniform film is formed. However, if the polymer binder is added, since specific resistance is excessively increased when firing is performed at a low temperature of 200° C. or less, the ink cannot be used in a field requiring excellent conductivity even though firing is performed at low temperature. Meanwhile, if the polymer binder is not included, after printing, cracks or pinholes are formed on the film or there is a problem of transferring defects of the pattern or straightness property defects.

Metal carboxylate plays two or more roles in the conductive ink composition of the present invention. First, metal carboxylate may be reduced into metal during a firing process to contribute to improving conductivity. Second, metal carboxylate may replace the polymer binder of known ink to improve a coating property of ink and improve transferring property and straightness property of the pattern.

It is preferable that a molecular weight of a component other than the metal particle, metal carboxylate, and a surfactant added if necessary of the conductive ink composition according to the present invention be less than 800. It is preferable that a component other than the metal particle and metal carboxylate of the conductive ink composition according to the present invention be liquid at normal temperature.

As long as metal carboxylate can be dissolved in an appropriate organic solvent, metal carboxylate is not particularly limited by a chain length of an alkyl group, whether branches are present or not, whether substituent groups are present or not and the like.

It is preferable that the use amount of metal carboxylate be 0.1 to 20 parts by weight based on 100 parts by weight of the content of the metal particle. In the case where metal carboxylate is included in the content of less than 0.1 parts by weight based on 100 parts by weight of the content of the metal particle, a contribution to improving the straightness property or conductivity of the pattern is insignificant. If the content of metal carboxylate is more than 20 parts by weight based on 100 parts by weight of the content of the metal particle, it is difficult to uniformly mix the metal particle and metal carboxylate, such that it is not easy to form a stable and uniform coat after printing.

The metal of metal carboxylate may be the same as or different from a kind of metal of the metal particle, and is preferably the same as the kind of metal of the metal particle. Silver is most preferable in consideration of conductivity. It is preferable that the number of carbon atoms of metal carboxylate be 2 to 10.

The conductive ink composition also includes two or more solvents. The first solvent is a solvent exhibiting relatively low volatility that is the vapor pressure of 3 torr or less at 25° C., and acts as a dispersion medium of the ink composition until printing and firing are performed. The second solvent is a solvent having the vapor pressure of more than 3 torr at 25° C. and high volatility, and a component that maintains the low viscosity of the ink composition and excellent coating property to the roller in conjunction with the first solvent until the ink composition is applied on a board or the roller and is removed by evaporation, thus increasing the viscosity of the ink composition and allowing forming and maintaining of the pattern on the roller to be well performed.

The use amount of the first solvent and the second solvent may be determined in consideration of a purpose, an operation environment and the like. It is preferable to increase the use amount of the second solvent that is the highly volatile solvent in order to reduce a tact time of a whole process when an ink coat is rapidly formed, and it is preferable to reduce the use amount of the second solvent in order to ensure a margin of the process by reducing a forming rate of the ink coat. Preferably, the first solvent may be controlled in the range of 0.1 to 60 wt %, and the second solvent may be controlled in the range of 1 to 80 wt %.

Examples of the lowly volatile solvent that may be used as the first solvent include dimethylacetamide, gamma-butyrolactone, hydroxytoluene, propyleneglycol monobutyl ether, propyleneglycol monopropyl ether, butyl cellosolve, glycerin, phenoxyethanol, butyl carbitol, methoxypropoxypropanol, carbitol, terpinol, triethyleneglycol monoethyl ether, triethyleneglycol monomethyl ether, N-methylpyrolidone, propylene carbonate, dimethyl sulfoxide, diethyleneglycol, triethanolamine, diethanolamine, triethyleneglycol, ethyleneglycol and the like, may be used by mixing two kinds or more, but are not limited thereto. Examples of the second solvent having high volatility may include dimethylglycol, trimethylchloromethane, methanol, ethanol, isopropanol, propanol, hexane, heptane, octane, 1-chlorobutane, methylethylketone, cyclohexane and the like, may be used by mixing two kinds or more, but are not limited thereto.

It is preferable that surface tension of the second solvent having high volatility be less than 26 dyn/cm so as to have excellent coating property to the roller in step i) of FIG. 1. Since the second solvent is mostly removed by volatilization before step ii) of FIG. 1, the first solvent having low volatility mainly remains in steps ii) and iii). It is preferable that surface tension of the first solvent be 26 dyn/cm or more in order to increase release ability of ink in steps ii) and iii).

It is preferable that the metal particle providing conductivity in the ink composition have the nano-scale average particle diameter in order to implement the fine pattern. For example, it is preferable to ensure the nano-scale average particle diameter and preferably the average particle diameter of 5 to 400 nanometers in order to implement the ultrafine pattern having the line width of less than 6 micrometers and the line interval of less than 3 micrometers. Silver or copper particles are preferable as the metal particles in view of high conductivity. Specific resistance of bulk silver is 1.59 $\mu\Omega \cdot cm$, which equates to be just 65% of that of gold having the next low specific resistance. Accordingly, when ink is manufactured by particularization in order to form the electrode and printed, even though the amount of additives other than silver particles is large, it is relatively easy to implement desired conductivity after firing as compared to other metals. Among the metals, specific resistance of silver is lower than that of copper and silver can implement conductivity without oxidation even though a separate inert gas atmosphere or a reduction atmosphere is not set, such that it is particularly preferable to use the silver particles as the metal particles for manufacturing ink.

The range of the use amount of the metal particles is not particularly limited, but is preferably 10 to 50 wt %. In the case where the use amount of the metal particle is more than 50 wt %, it is not easy to control initial viscosity of ink to 20 cps or less, and a cost of ink is increased. In the case where the use amount of the metal particle is less than 10 wt %, an amount of a functional component implementing a function of conductivity of ink is unnecessarily reduced, which is not effective. The initial viscosity of ink may be controlled to 1 cps or more.

In the case where a polymer binder is used like known general ink, even though the use amount of the metal particle is less than 10 wt %, is an appropriate polymer binder is used, it is possible to form a uniform film after ink is applied on a roller, but like the present invention, if the metal particle is used in an amount of less than 10 wt % in a state where the polymer binder component is not separately added, it is not easy to form a uniform film without defects such as pinholes or cracks by applied ink.

The ink composition of the present invention does not use the polymer binder but use metal carboxylate so as to have excellent conductivity even though firing is performed at low temperatures. In the case where metal carboxylate and the metal particle are used together, there is an advantage in that metal carboxylate is reduced into metal during a firing process to fill voids between the metal particles, thus improving conductivity.

It is preferable that the initial viscosity of the conductive ink composition be 20 cps or less, and it is more preferable that the initial viscosity be 10 cps or less. It is advantageous in that the initial viscosity be within the aforementioned range in view of a coating property.

The initial surface energy of the conductive ink composition is preferably 24 dyn/cm or less, and preferably 21.1 to 23.9 dyn/cm. It is advantageous in that the initial surface energy be within the aforementioned range in view of a coating property.

The conductive ink composition according to the present invention may further include a surfactant. As the surfactant, a general leveling agent, for example, silicon-based, fluorine-based or polyether-based surfactants may be used. It is preferable that the content of the surfactant be 0.01 to 5 wt %.

The conductive ink composition according to the present invention may be manufactured by mixing the aforementioned components with each other and filtering the components by using a filter, if necessary.

The finer conductive pattern may be favorably formed on the substrate by applying a reverse offset process of roll printing processes by using the conductive metal ink composition. Particularly, if the conductive ink composition is applied to the reverse offset process, a fine conductive pattern that cannot be formed by a previously applied inkjet printing method and the like, for example, a conductive pattern having a line width and a line interval of several micrometers to several tens micrometers, specifically about 3 to 80 μm and preferably about 3 to 40 μm may be favorably formed. Particularly, the fine conductive pattern having a line width of about 3 to 10 μm and a line interval of about 3 to 10 μm may be favorably formed by using the conductive ink composition and the roll printing process.

Since the polymer binder is not present in the present invention, even though firing is performed at a relatively low temperature of 200° C. or less, preferably 110 to 200° C., and more preferably 130 to 200° C., the conductive pattern having excellent conductivity may be formed. Accordingly, the fine conductive pattern exhibiting excellent conductivity at low temperatures may be provided by applying the conductive ink composition and the method of forming the conductive pattern according to the present invention. This may be used, for example, as an electrode pattern and the like of a flexible display diode and a flat display diode, thereby largely contributing to improving visibility or enlarging an area of the flexible display diode and flat display diode.

When the conductive ink composition according to the present invention is fired, a firing time may be selected according to the component and composition of the composition, and for example, firing may be performed for 3 to 60 min.

The present invention provides a printing method using the conductive ink composition. This method includes printing the conductive ink composition and firing the conductive ink composition. The printing method is preferably a roll printing method and more preferably a reverse offset printing method. After the printing, the firing temperature and time are as described above.

The present invention also provides a conductive pattern formed by using the conductive ink composition, and an electrode substrate including the same.

Even in the case where the conductive pattern according to the present invention is fired at a low temperature of 200° C. or less, the conductive pattern may have low specific resistance of less than 25 μΩ·cm. It may have excellent adhesion strength to a board, and the line width and the line interval of 3 to 80 μm, preferably about 3 to 40 μm, and more preferably about 3 to 10 μm. Since the specific resistance is low, it is not necessary to increase the line height, visibility of the diode is improved, and there is an advantage in view of slimness. The feasible line height may be changed according to the printing line width and line interval, but desired conductivity may be implemented by the line height of less than 1 μm. In the present invention, if necessary, the line height may be controlled to 100 nm or more.

For example, the specific resistance of the conductive pattern according to the present invention may be 30 μΩ·cm or less, preferably 20 μΩ·cm or less, and more preferably 10 μΩ·cm. The conductive pattern according to the present invention may have an opening ratio of 90% or more, and provide a transparent conductive film having surface resistance of 15Ω/□ or less, preferably 10Ω/□ or less, and more preferably 5Ω/□ or less while even having the line height of less than 1 μm, preferably 500 nm or less, and more preferably 200 nm or less.

A specific example thereof is one of the applied examples implemented by using the conductive ink composition according to the present invention, and includes a transparent conductive film that can be applied to a touch screen and the like. In the case of the ITO/PET film that is the transparent conductive film used in a known touch screen, surface resistance is 50 to 300Ω/□. However, in the case where the ink composition suggested in Example 1 according to an exemplary embodiment of the present invention to be described below is printed on the board to perform firing at 150° C. for 30 min, since specific resistance is less than 10 μΩ·cm, it is possible to manufacture the transparent conductive film having surface resistance of about 5Ω/□ while increasing transmittance by using the pattern having the opening ratio of 90% or more by even a film thickness of less than 200 nm. Accordingly, it is possible to manufacture the transparent conductive film having conductivity that is higher than that of a known transparent conductive film, of which an entire surface is coated, such as an ITO film, which is advantageous to enlarge an area of a touch screen panel. The shape of the conductive pattern may be determined according to the final purpose. The pattern may be a regular pattern such as a mesh pattern or irregular pattern.

Since the conductive ink composition according to the present invention can be fired at low temperatures, the conductive ink composition may be applied to a flexible display or a transparent conductive film.

The electrode substrate may be a constitution including a board and a conductive pattern provided on the board. The board may be selected according to the target purpose, and may be a glass or plastic substrate or film.

The electrode substrate may be used in various electronic diodes, for example, display diodes, touch panels and the like.

Hereinafter, the present invention will be described in detail with reference to Examples and Comparative Examples. However, the Examples and Comparative Examples are set forth to illustrate the present invention, but the scope of the present invention is not limited thereto.

Example 1

30 g of the silver nanoparticle having the average particle diameter of 120 nm, 1.7 g of silver neodecanoate (Ag-neodecanoate), 0.6 g of the silicon-based surfactant, 4 g of terpineol (vapor pressure of 0.042 torr at 25° C.; surface tension of 33.2 mN/m) and 36 g of propyl cellosolve (vapor pressure of 0.98 torr at 25° C.; surface tension of 26.3 mN/m) as the first solvent, and 33 g of ethanol (vapor pressure of 59.3 torr at 25° C.; surface tension of 22.1 mN/m) as the second solvent were mixed, agitated for 24 hours, and filtered by the filter of 1 micrometer to manufacture the ink composition.

The surface energy of the ink composition was 22.0 dyn/cm.

After the ink composition was applied on the PDMS blanket of the roller, the pattern of the ink composition was formed on the roller by bringing a cliché where the desired conductive pattern was intaglioed into contact with the blanket. Thereafter, the pattern was formed on the glass substrate by bringing the roller into contact with the glass substrate. The resulting substrate was fired in the oven for 30 min to form the conductive pattern. In this case, the temperature of the oven was 130° C., 150° C. and 200° C.

Thereafter, the shape of the pattern was observed by the optical microscope. The specific resistance was calculated by measuring the surface resistance by the 4-point probe, measuring the thickness from the surface profiler (alpha step), multiplying two measured values and adjusting units.

Example 2

25 g of the silver nanoparticle having the average particle diameter of 70 nm, 1 g of silver butyrate (Ag-butyrate), 0.6 g of the silicon-based surfactant, 5 g of butyl cellosolve (vapor pressure of 0.76 torr at 25° C.; surface tension of 27.4 mN/m), 37 g of propyl cellosolve (vapor pressure of 0.98 torr at 25° C.; surface tension of 26.3 mN/m) and 1 g of ethanolamine (vapor pressure of 0.4 torr at 25° C.; surface tension of 48.3 mN/m) as the first solvent, and 34 g of ethanol (vapor pressure of 59.3 torr at 25° C.; surface tension of 22.1 mN/m) as the second solvent were mixed, agitated for 24 hours, and filtered by the filter of 1 micrometer to manufacture the ink composition.

The surface energy of the ink composition was 22.1 dyn/cm.

Figure 2:
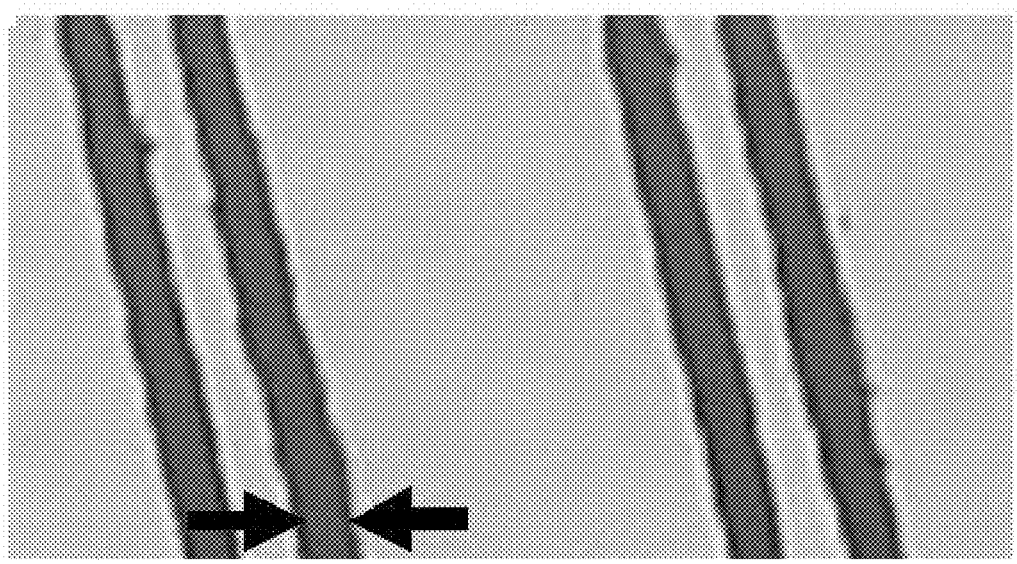
FIG. 2 is a picture illustrating a conductive pattern manufactured in Example 2.

Subsequently, printing/firing were performed by the same method as Example 1 to form the conductive pattern, and evaluation was performed by the same method. FIG. 2 is an example of the shape of the pattern formed in Example 2.

Comparative Example 1

30 g of the silver nanoparticle having the average particle diameter of 120 nm, 1.2 g of the urethane-based polymer binder, 0.6 g of the surfactant, 2 g of butyl cellosolve (vapor pressure of 0.76 torr at 25° C.; surface tension of 27.4 mN/m) and 36 g of propyl cellosolve (vapor pressure of 0.98 torr at 25° C.; surface tension of 26.3 mN/m) as the first solvent, and 33 g of ethanol (vapor pressure of 59.3 torr at 25° C.; surface tension of 22.1 mN/m) as the second solvent were mixed, agitated for 24 hours, and filtered by the filter of 1 micrometer to manufacture the ink composition.

Subsequently, printing/firing were performed by the same method as Example 1 to form the conductive pattern, and evaluation was performed by the same method.

Comparative Example 2

30 g of the silver nanoparticle having the average particle diameter of 120 nm, 1.7 g of silver neodecanoate (Ag-neodecanoate), 0.6 g of the surfactant, and 73 g of terpineol (vapor pressure of 0.042 torr at 25° C.; surface tension of 33.2 mN/m) as the first solvent were mixed, agitated for 24 hours, and filtered by the filter of 1 micrometer to manufacture the ink composition. The second solvent was not used.

Subsequently, the ink composition was applied on the PDMS blanket of the roller by the same method as Example 1, many visible pinholes were observed on the blanket, such that it was impossible to perform printing.

Comparative Example 3

30 g of the silver nanoparticle having the average particle diameter of 120 nm, 1.7 g of silver trifluoroacetate (Ag-trifluoroacetate), 0.6 g of the surfactant, and 73 g of ethanol (vapor pressure of 59.3 torr at 25° C.; surface tension of 22.1 mN/m) as the second solvent were mixed, agitated for 24 hours, and filtered by the filter of 1 micrometer to manufacture the ink composition. The first solvent was not used.

Subsequently, the ink composition was applied on the PDMS blanket of the roller by the same method as Example 1, ink was instantaneously dried after the application to be attached to the blanket, such that it was impossible to transfer the pattern on glass that was the board.

Comparative Example 4

30 g of silver butyrate (Ag-butyrate), 0.6 g of the surfactant, 25 g of diethylenetriamine (vapor pressure of 0.569 torr at 25° C.; surface tension of 43.8 mN/m) as the first solvent, and 55 g of ethanol (vapor pressure of 59.3 torr at 25° C.; surface tension of 22.1 mN/m) as the second solvent were mixed, agitated for 24 hours, and filtered by the filter of 1 micrometer to manufacture the ink composition.

Subsequently, the ink composition was applied on the PDMS blanket of the roller by the same method as Example 1, and it was impossible to clearly transfer the ink coat of the blanket on glass even after 1 hour.

Comparative Example 5

25 g of the silver nanoparticle having the average particle diameter of 70 nm, 0.6 g of the surfactant, 5 g of butyl cellosolve (vapor pressure of 0.76 torr at 25° C.; surface tension of 27.4 mN/m) and 35 g of propyl cellosolve (vapor pressure of 0.98 torr at 25° C.; surface tension of 26.3 mN/m) as the first solvent, 35 g of ethanol (vapor pressure of 59.3 torr at 25° C.; surface tension of 22.1 mN/m) as the second solvent, and 1 g of propyleneglycol monomethyl ether acetate (vapor pressure of 3.8 torr at 25° C.; surface tension of 26.9 mN/m) were mixed, agitated for 24 hours, and filtered by the filter of 1 micrometer to manufacture the ink composition. Silver carboxylate was not added.

Figure 3:
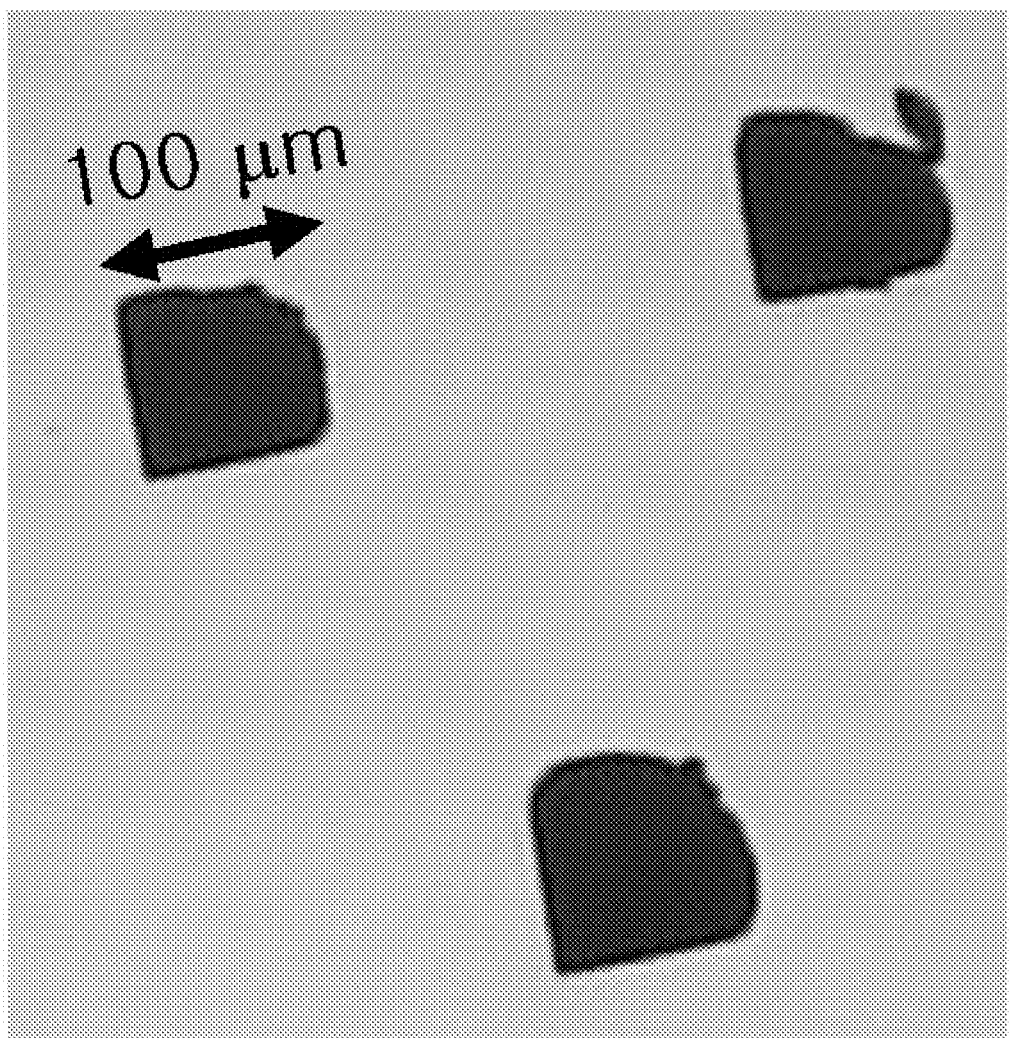
FIG. 3 is a picture illustrating a conductive pattern manufactured in Comparative Example 5.

Subsequently, the pattern of the ink composition was to be formed by the same method as Example 1, but since the straightness property of the pattern was not good, it was impossible to form the fine pattern. FIG. 3 is an example of the shape of the pattern formed in Comparative Example 5.

Example 3

25 g of the silver nanoparticle having the average particle diameter of 70 nm, 1 g of silver isobutyrate (Ag-isobutyrate), 0.7 g of the surfactant, 5 g of butyl cellosolve (vapor pressure of 0.76 torr at 25° C.; surface tension of 27.4 mN/m), 37 g of propyl cellosolve (vapor pressure of 0.98 torr at 25° C.; surface tension of 26.3 mN/m) and 0.7 g of ethanolamine (vapor pressure of 0.4 torr at 25° C.; surface tension of 48.3 mN/m) as the first solvent, and 34 g of methyl cellosolve (vapor pressure of 9.5 torr at 25° C.; surface tension of 31.34 mN/m) as the second solvent were mixed, agitated for 24 hours, and filtered by the filter of 1 micrometer to manufacture the ink composition.

Figure 4:
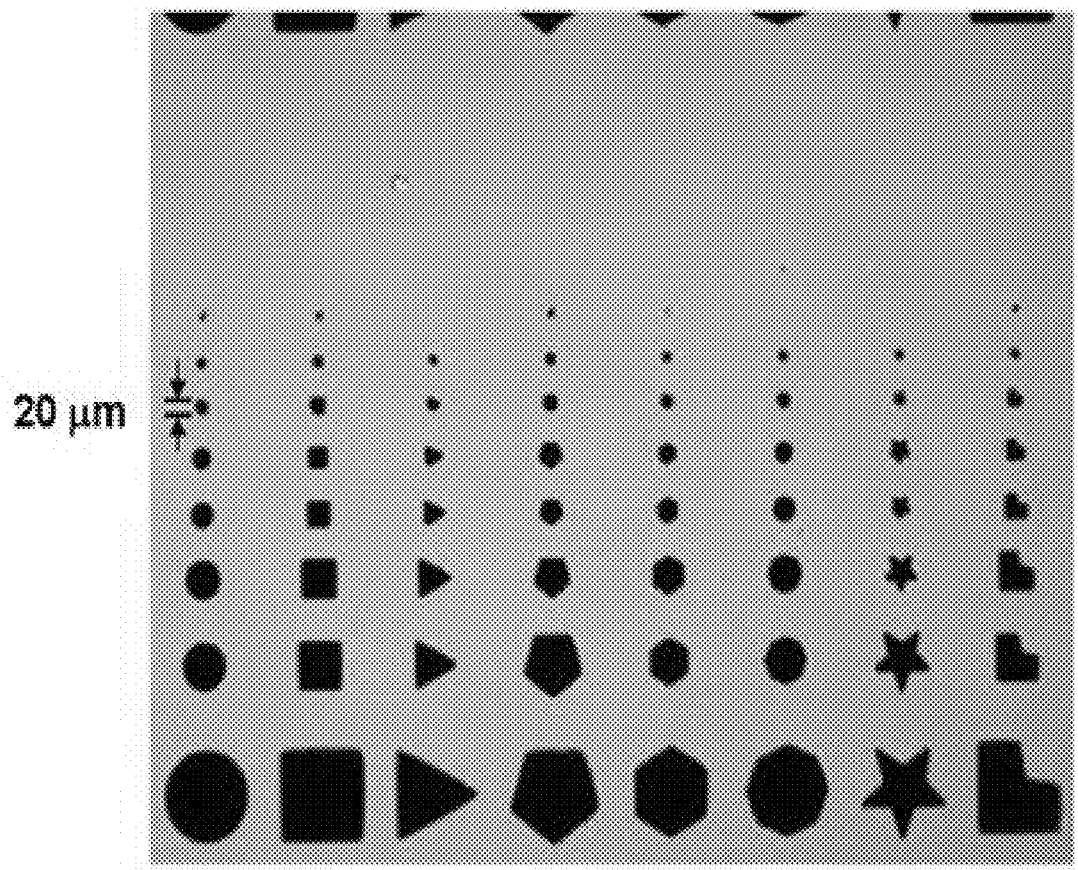
FIG. 4 is a picture illustrating a conductive pattern manufactured in Example 3.

Subsequently, the pattern of the ink composition was formed on the glass substrate by the same method as Example 1, many visible pinholes were observed in some regions, but in the case of the region where the pattern was formed, as shown in FIG. 4, the favorable pattern was printed.

Comparative Example 6

25 g of the silver nanoparticle having the average particle diameter of 70 nm, 0.7 g of the surfactant, 7 g of butyl cellosolve (vapor pressure of 0.76 torr at 25° C.; surface tension of 27.4 mN/m) and 34 g of propyl cellosolve (vapor pressure of 0.98 torr at 25° C.; surface tension of 26.3 mN/m) as the first solvent, 34 g of ethanol (vapor pressure of 59.3 torr at 25° C.; surface tension of 22.1 mN/m) as the second solvent, and 0.3 g of silver nitrate used instead of silver carboxylate were mixed, agitated for 24 hours, and filtered by the filter of 1 micrometer to manufacture the ink composition. Silver carboxylate was not added.

Subsequently, the pattern of the ink composition was to be formed by the same method as Example 1, but it was impossible to perform printing because piling of the pattern occurred.

Comparative Example 7

The ink composition having the same composition as Comparative Example 6 was manufactured, except that 0.3 g of bismuth chloride was used instead of silver nitrate. In this case, the pattern of the ink composition was to be formed by the same method as Example 1, but since the straightness property of the pattern was not good, it was impossible to form the fine pattern.

In Comparative Examples 6 and 7, other metal salts were used instead of metal carboxylate, which exhibited a very poor effect as compared to the case where metal carboxylate was used.

Comparative Example 8

25 g of the silver nanoparticle having the average particle diameter of 70 nm, 1 g of silver butyrate (Ag-butyrate), 0.6 g of the silicon-based surfactant, 5 g of butyl cellosolve (vapor pressure of 0.76 torr at 25° C.; surface tension of 27.4 mN/m), 36 g of propyl cellosolve (vapor pressure of 0.98 torr at 25° C.; surface tension of 26.3 mN/m) and 1 g of ethanolamine (vapor pressure of 0.4 torr at 25° C.; surface tension of 48.3 mN/m) as the first solvent, 34 g of ethanol (vapor pressure of 59.3 torr at 25° C.; surface tension of 22.1 mN/m) as the second solvent, and 0.01 g of KF-96L-100cs as the release agent were mixed, agitated for 24 hours, and filtered by the filter of 1 micrometer to manufacture the ink composition.

The surface energy of the ink composition was 22.0 dyn/cm.

Subsequently, printing was performed by the same method as Example 1, ink was not appropriately dried but wet even though 10 min or more passes after ink was applied on the printing blanket, such that piling occurred when transferring was performed on the board. The surface was visibly nonuniform and gray after ink was applied, and thus it was judged that dispersion of silver nanoparticles was poor.

Comparative Example 9

25 g of the silver nanoparticle having the average particle diameter of 70 nm, 1 g of silver butyrate (Ag-butyrate), 0.6 g of the silicon-based surfactant, 5 g of butyl cellosolve (vapor pressure of 0.76 torr at 25° C.; surface tension of 27.4 mN/m), 36 g of propyl cellosolve (vapor pressure of 0.98 torr at 25° C.; surface tension of 26.3 mN/m) and 1 g of ethanolamine (vapor pressure of 0.4 torr at 25° C.; surface tension of 48.3 mN/m) as the first solvent, 34 g of ethanol (vapor pressure of 59.3 torr at 25° C.; surface tension of 22.1 mN/m) as the second solvent, and 0.2 g of polyvinylpyrrolidone having the molecular weight of 40,000 as the polymer binder were mixed, agitated for 24 hours, and filtered by the filter of 1 micrometer to manufacture the ink composition.

The surface energy of the ink composition was 22.0 dyn/cm.

Subsequently, printing and firing were performed by the same method as Example 1 to form the conductive pattern, and evaluation was performed by the same method.

Comparative Example 10

25 g of the silver nanoparticle having the average particle diameter of 70 nm, 1 g of silver butyrate (Ag-butyrate), 0.3 g of the fluorine-based surfactant, 5 g of butyl cellosolve (vapor pressure of 0.76 torr at 25° C.; surface tension of 27.4 mN/m), 37 g of propyl cellosolve (vapor pressure of 0.98 torr at 25° C.; surface tension of 26.3 mN/m) and 1 g of ethanolamine (vapor pressure of 0.4 torr at 25° C.; surface tension of 48.3 mN/m) as the first solvent, 34 g of ethanol (vapor pressure of 59.3 torr at 25° C.; surface tension of 22.1 mN/m) as the second solvent, and 0.2 g of polyvinylpyrrolidone having the molecular weight of 40,000 as the polymer binder were mixed, agitated for 24 hours, and filtered by the filter of 1 micrometer to manufacture the ink composition.

The surface energy of ink of the ink composition was 17.0 dyn/cm.

Subsequently, printing was performed by the same method as Example 1, many pinholes having the diameter of 1 mm or more was formed on the printing blanket, and a portion on which ink was applied was not released from the blanket, such that it was impossible to perform transferring on the board.

Specific resistances of the conductive patterns manufactured in Example 1, Example 2, Comparative Example 1 and Comparative Example 9 are described in the following Table 1.

TABLE 1

| Firing temperature | Specific resistance for firing temperature (μΩ · cm) | | |
|---|---|---|---|
| | 130° C. | 150° C. | 200° C. |
| Example 1 | 10.87 | 9.95 | 8.61 |
| Example 2 | 34.7 | 16.7 | 19.3 |
| Comparative Example 1 | Out of range | Out of range | 17.87 |
| Comparative Example 9 | Out of range | Out of range | 22.18 |

As shown in Table 1, it can be confirmed that in Example 1 and Example 2, even though the firing temperature is low, specific resistance is low, but since the binder is used in Comparative Example 1 and Comparative Example 9, specific resistance is largely increased when firing is performed at low temperatures.

It will be apparent to those skilled in the art that various modifications and changes may be made without departing from the scope and spirit of the invention.

Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The invention claimed is:

1. A conductive ink composition, comprising:
    metal particles;
    a first solvent having a vapor pressure of 3 torr or less at 25° C.;
    a second solvent having a vapor pressure of more than 3 torr at 25° C.; and
    metal carboxylate; and
    a surfactant,
        wherein the conductive ink composition does not include a polymer binder or a release agent, and
        wherein the surfactant is a silicon-based, fluorine-based, or polyether-based surfactant.

2. The conductive ink composition of claim 1, wherein a kind of metal of the metal particles and a kind of metal of metal carboxylate are the same as each other.

3. The conductive ink composition of claim 1, wherein the metal particles are silver particles, and metal carboxylate is silver carboxylate.

4. The conductive ink composition of claim 1, wherein a surface tension of the second solvent is less than 26 dyn/cm, and the surface tension of the first solvent is 26 dyn/cm or more.

5. The conductive ink composition of claim 1, wherein the metal particle has an average particle diameter of 5 to 400 nanometers.

6. The conductive ink composition of claim 1, wherein an initial viscosity of the conductive ink composition is 20 cps or less.

7. The conductive ink composition of claim 1, wherein an initial viscosity of the conductive ink composition is 1 cps or more and 10 cps or less.

8. The conductive ink composition of claim 1, wherein an initial surface energy of the conductive ink composition is 24 dyn/cm or less.

9. The conductive ink composition of claim 1, wherein an initial surface energy of the composition is 21.1 to 23.9 dyn/cm.

10. The conductive ink composition of claim 1, wherein the number of carbon atoms of metal carboxylate is 2 to 10.

11. The conductive ink composition of claim 1, wherein the composition is a matter for a roll printing method.

12. The conductive ink composition of claim 1, wherein the composition is a matter for a reverse offset printing method.

13. The conductive ink composition of claim 1, wherein the composition is a matter for low temperature firing.

14. A printing method comprising:
    printing the conductive ink composition of claim 1; and
    firing the conductive ink composition.

15. The printing method of claim 14, wherein the printing method is a roll printing method.

16. The printing method of claim 14, wherein the printing method is a reverse offset printing method.

17. The printing method of claim 14, wherein the firing is performed at 200° C. or less.

* * * * *